United States Patent
Inai et al.

(10) Patent No.: US 6,605,831 B1
(45) Date of Patent: Aug. 12, 2003

(54) FIELD-EFFECT SEMICONDUCTOR DEVICE

(75) Inventors: Makoto Inai, Omihachiman (JP); Hidehiko Sasaki, Moriyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/659,134

(22) Filed: Sep. 11, 2000

(30) Foreign Application Priority Data

Sep. 9, 1999 (JP) .......................................... 11-256051

(51) Int. Cl.$^7$ .................. H01L 31/0328; H01L 31/0336
(52) U.S. Cl. .................. 257/194; 257/192; 257/195; 438/167; 438/172; 438/285; 438/590
(58) Field of Search .................. 257/192, 194, 257/195; 438/285, 590, 167, 172

(56) References Cited

U.S. PATENT DOCUMENTS

| | | | | |
|---|---|---|---|---|
| 5,959,317 A | * | 9/1999 | Niwa | 257/194 |
| 6,057,566 A | * | 5/2000 | Eisenbeiser et al. | 257/194 |
| 6,281,528 B1 | * | 8/2001 | Wada | 257/200 |
| 6,351,000 B1 | | 2/2002 | Oikawa | |

FOREIGN PATENT DOCUMENTS

| | | |
|---|---|---|
| JP | 2-285682 | 11/1990 |
| JP | 6-252175 | 9/1994 |
| JP | 6-267994 | 9/1994 |
| JP | 7-147395 | 6/1995 |
| JP | 11-177079 | 7/1999 |
| JP | 2000-349280 | 12/2000 |

OTHER PUBLICATIONS

Makoto et al., "Doped Channel HFET with Effective Lateral Energy Modulation for High Power Enhancement Operation", International Conference on Solid State Devices and Materials (SSDM'98), 1998, pp 328–329.*

Makoto Inai, et al. "Doped Channel HFET with Effective Lateral Energy Modulation for High Power Enhancement Operation" Japanese Journal of Applied Physics, Supplements, Extended Abstracts of the 1998 International Conference on Solid State Devices and Materials (SSDM '98), Hiroshima, JP, Sep. 1998, pp. 328–329.

S. Sethi, et al. "Backgating in Pseudomorphic $In_{0.15}Ga_{0.85}As/Al_{0.25}Ga_{0.75}As$ MODFET's with a GaAs:Er Buffer Layer" IEEE Electron Device Letters, vol. 16, No. 12, Dec. 1995, pp. 537–539; and.

Takatomo Enoki, et al. "Delay Time Analysis for 0.4– to 5–$\mu$m–Gate InAlAs–InGaAs HEMT's", IEEE Electron Device Letters, vol. 11, No. 11, Nov. 1990, pp. 502–504.

* cited by examiner

Primary Examiner—Tom Thomas
Assistant Examiner—Donghee Kang
(74) Attorney, Agent, or Firm—Keating & Bennett, LLP (57) ABSTRACT

A field-effect semiconductor device includes a channel layer; a barrier structure formed on the channel layer and including a plurality of semiconductor layers; a plurality of ohmic electrodes formed above the barrier structure; and a Schottky electrode formed on the barrier structure between the ohmic electrodes. The barrier structure has an electron-affinity less than that of the channel layer and includes at least two heavily doped layers and a lightly doped layer provided therebetween.

11 Claims, 10 Drawing Sheets

FIELD-EFFECT SEMICONDUCTOR DEVICE

BACKGROUND OF THE INVENTION

1. Field of the Invention

The present invention relates to semiconductor devices, and more specifically, it relates to a field-effect semiconductor device having a heterojunction structure, such as an HEMT structure or a DCHFET structure.

2. Description of the Related Art

Hitherto, as transistor devices operating in the microwave to millimeter wave range, field-effect transistors (hereinafter referred to as heterojunction FETs) having heterojunction structures have been used. In accordance with doping structures, the heterojunction FET is roughly classified into an HEMT (a high-electron-mobility transistor) using a modulation-doped structure and a DCHFET (a doped channel heterostructure FET) using a doped channel structure. In this connection, the latter DCHFET is also called a DMT, an MISFET, an HIGFET, and the like.

Figure 1:
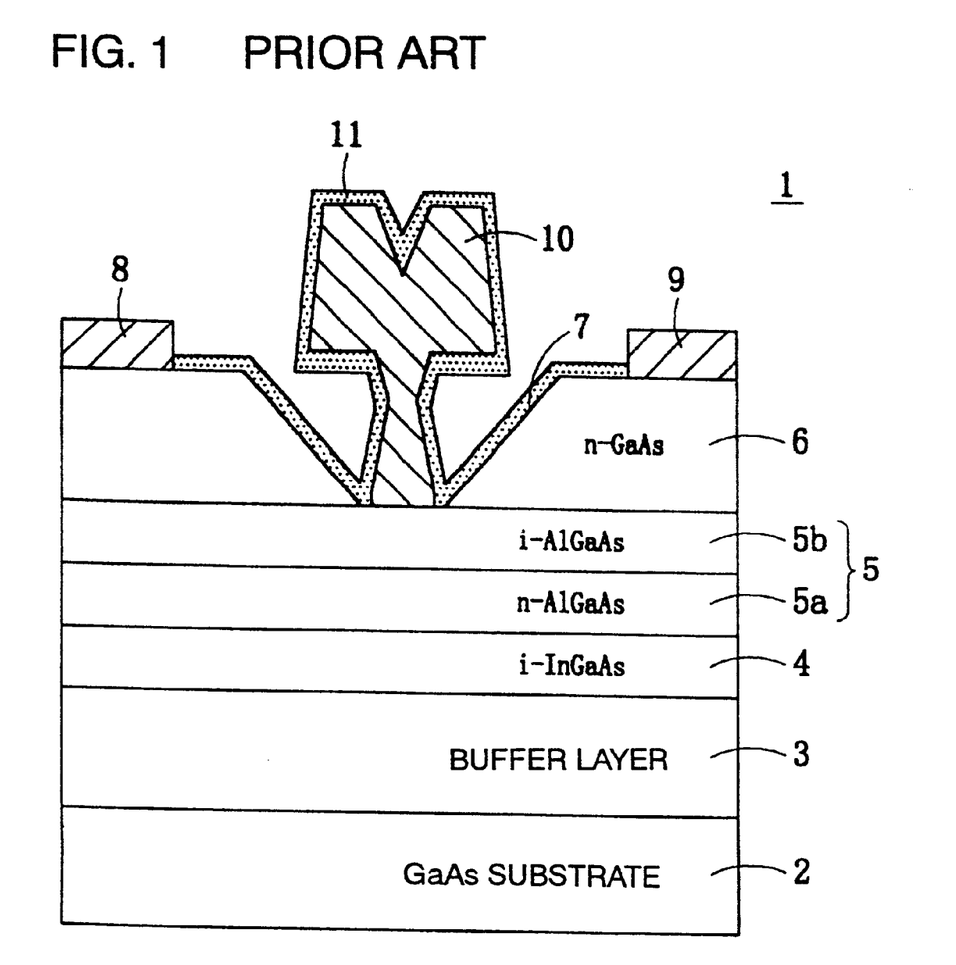
FIG. 1 is a schematic cross-sectional view showing the structure of a conventional HEMT.

FIG. 1 is a schematic cross-sectional view showing a semiconductor structure of a conventional HEMT. In an HEMT 1, a buffer layer 3 is formed on a gallium arsenide (GaAs) substrate 2, a channel layer 4 composed of undoped indium gallium arsenide (InGaAs) is formed on the buffer layer 3, and a barrier structure 5 is formed on the channel layer 4. The barrier structure 5 in FIG. 1 comprises an n-type aluminum gallium arsenide (AlGaAs) layer 5a and an undoped AlGaAs layer 5b. The barrier structure 5 may comprises more than two layers, for example, an undoped AlGaAs layer, an n-type AlGaAs layer, and an undoped AlGaAs layer, or it may comprises only an n-type AlGaAs layer. On the barrier structure 5, in order to form good ohmic contacts with a source electrode 8 and a drain electrode 9, a contact layer 6 composed of n-type GaAs is formed. On the upper surface of the contact layer 6, the source electrode 8 and the drain electrode 9 are formed to be in ohmic contact with the contact layer 6 by heat treatment.

Between the source electrode 8 and the drain electrode 9, the contact layer 6 is etched so as to form a recess therein, and the undoped AlGaAs layer 5b in the barrier structure 5 is exposed in a recess 7. The recess is formed by selectively removing the contact layer 6 by etching using an etchant that does not etch AlGaAs but which etches GaAs, and by terminating the etching at the undoped AlGaAs layer 5b. A gate electrode 10 is formed on the upper surface of the undoped AlGaAs layer 5b that is exposed from the contact layer 6 in the recess 7 and is in Schottky contact with the undoped AlGaAs layer 5b. In addition, the surface of the HEMT 1 is covered with a protective layer 11 composed of SiN (silicon nitride).

Figure 2A:
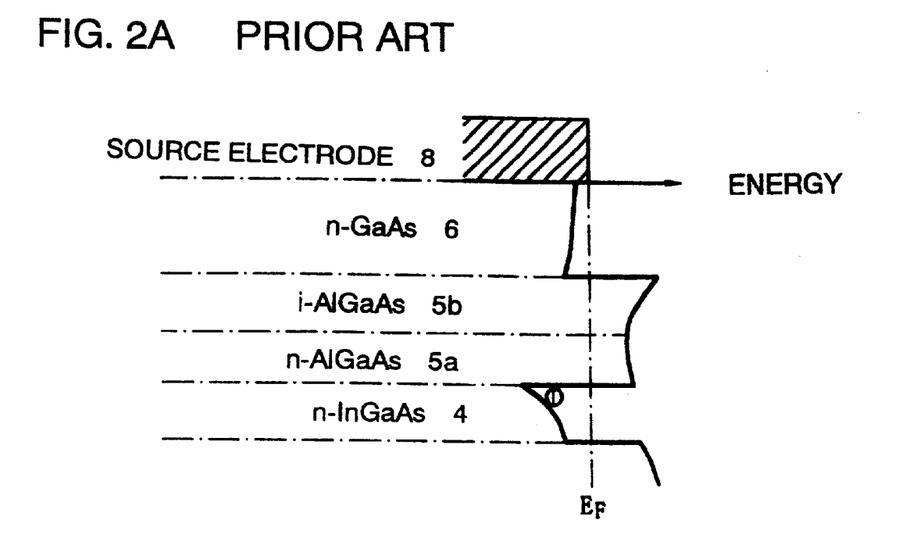
FIG. 2A is a view showing the energy band structure of a conduction band under the source and the drain electrodes of the HEMT mentioned above.
Figure 2B:
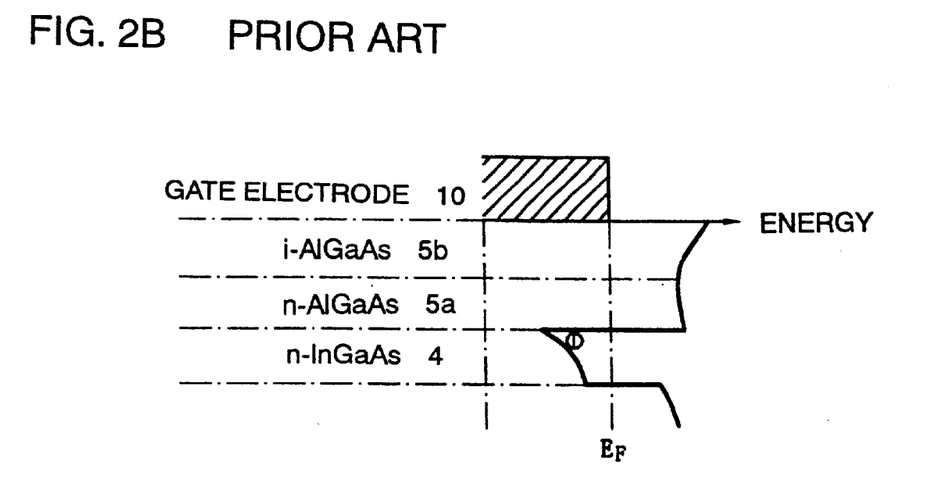
FIG. 2B is a view showing the energy band structure of a conduction band under the gate electrode of the HEMT mentioned above.

In the HEMT structure described above, the energy-band structure (the bottom of the conduction band) under the source electrode 8 and the drain electrode 9 and the energy-band structure (the bottom of the conduction band) under the gate electrode 10 are as shown in FIGS. 2A and 2B, respectively. Electrons in the n-type AlGaAs layer 5a move over the heterojunction between the AlGaAs and the InGaAs to the channel layer 4 side that has a lower energy level. The electrons (two-dimensional electron gas) thus supplied from the barrier structure 5 to the highly purified channel layer 4 can drift without being scattered by donors in the barrier structure 5, so that the electrons have high mobility. That is, the channel layer 4 functions as a channel in which electrons flow, and the barrier structure 5 functions as a supplying source for supplying electrons to the channel layer, so that, when a potential difference is applied between the source electrode 8 and the drain electrode 9, a drain current flows in the channel layer 4.

Figure 3:
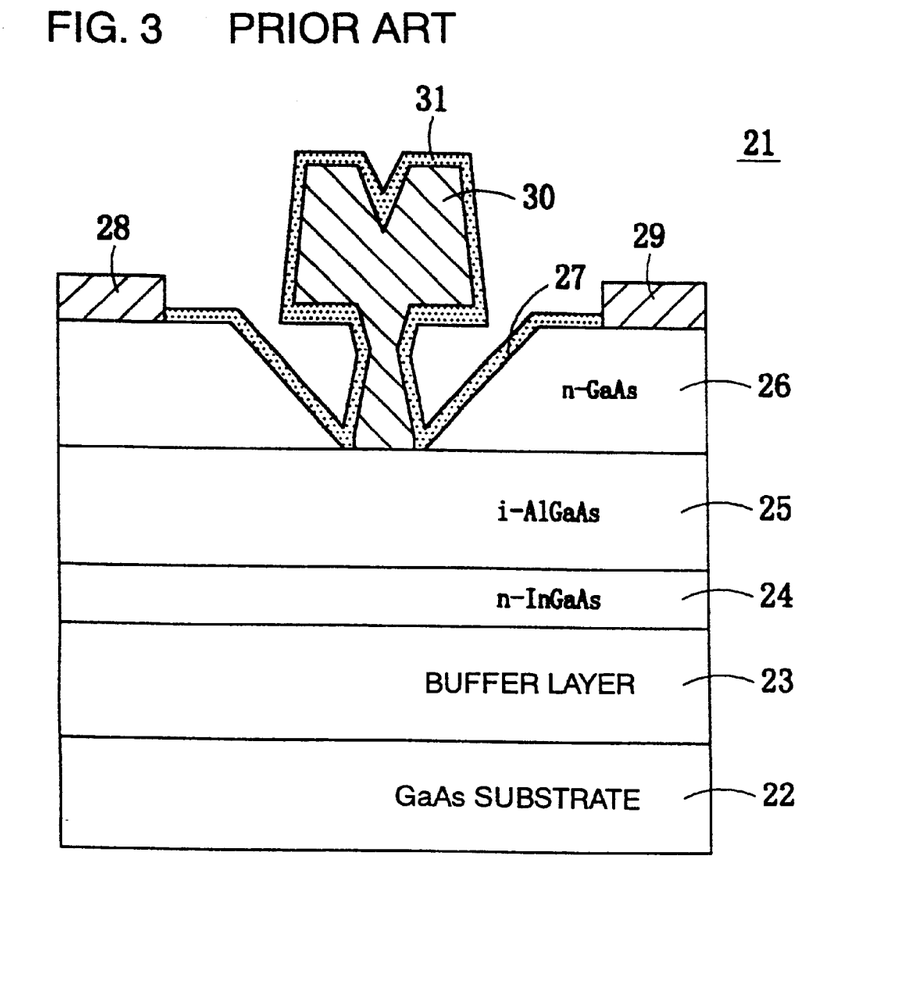
FIG. 3 is a schematic cross-sectional view showing the structure of a conventional DMT.

FIG. 3 is a schematic cross-sectional view showing a semiconductor structure of a DMT among conventional DCHFETs. In a DMT 21, a buffer layer 23 is formed on a semi-insulating GaAs substrate 22, a channel layer 24 composed of n-type InGaAs is formed on the buffer layer 23, and a barrier structure 25 is formed on the channel layer 24. The barrier structure 25 in the DMT structure is formed of undoped AlGaAs. On the barrier structure 25, in order to form good ohmic contacts with a source electrode 28 and a drain electrode 29, a contact layer 26 composed of n-type GaAs is formed. The source electrode 28 and the drain electrode 29 are formed on the upper surface of the contact layer 26 and are in ohmic contact therewith by heat treatment.

Between the source electrode 28 and the drain electrode 29, the contact layer 26 is selectively etched so as to form a recess therein, and as a result, the barrier structure 25 is exposed in a recess 27. A gate electrode 30 is formed on the upper surface of the barrier structure 25 that is exposed from the contact layer 26 in the recess 27 and is in Schottky contact with the barrier structure 25. In addition, the surface of the DMT 21 is covered with a protective layer 31 composed of SiN.

Figure 4A:
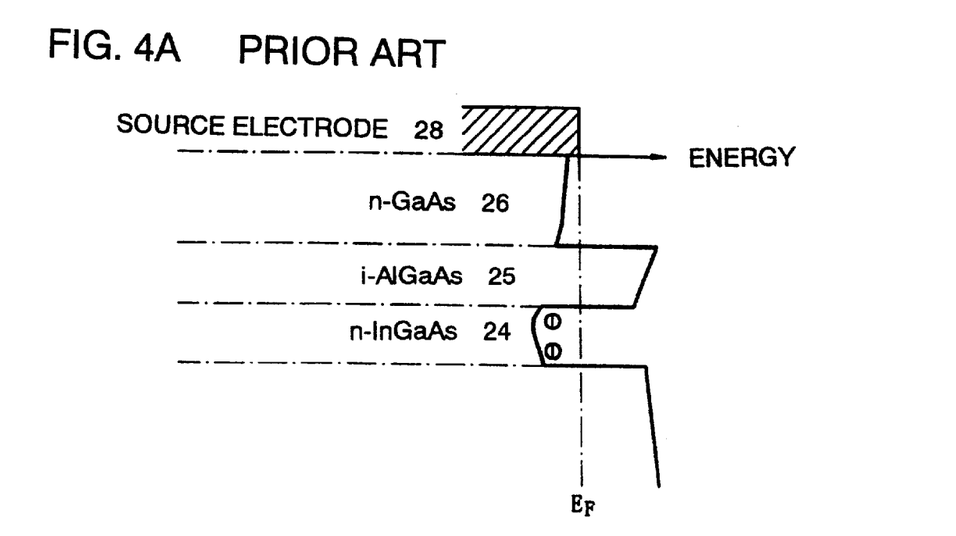
FIG. 4A is a view showing the energy band structure of a conduction band under the source and the drain electrodes of the DMT mentioned above.
Figure 4B:
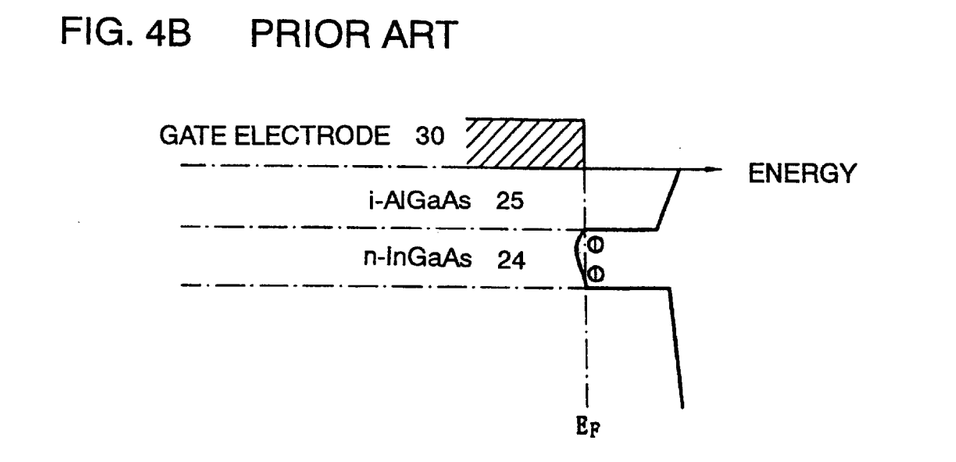
FIG. 4B is a view showing the energy band structure of a conduction band under the gate electrode of the DMT mentioned above.

In the DMT structure described above, the energy-band structure (the bottom of conduction band) under the source electrode 28 and the drain electrode 29 and the energy-band structure (the bottom of the conduction band) under the gate electrode 30 are as shown in FIGS. 4A and 4B, respectively. In the state in which voltage is not applied to the gate electrode 30, electrons are stored in the n-type channel layer 24, and when in this state a potential difference is applied between the source electrode 28 and the drain electrode 29, electrons as carriers move from the source electrode 28 to the drain electrode 29, so that a drain current flows.

In the HEMT structure and also in the DMT structure, one of the functions of the barrier structure is to form a barrier to the gate electrode. That is, due to the presence of a high energy barrier between the gate electrode and the channel layer (the case of the HEMT is shown in FIG. 2A, and the case of the DMT is shown in FIG. 4B), it is difficult for electrons to move over the barrier structure or tunnel through the barrier structure, so that current leakage to the gate electrode is prevented. Accordingly, the channel can be opened up to a higher current, and a higher breakdown voltage of the gate can be realized, so that high power output can be obtained.

The capacity of the barrier structure to inhibit current flow thus described is determined by the barrier height and the thickness of the barrier structure. The barrier height is determined by the difference between the work functions of the barrier structure and the gate electrode. In addition, the thickness of the barrier structure is determined by the dopant concentration therein. By forming a layer having lower dopant concentration as a barrier structure, the effective thickness of the barrier structure can be increased, and hence, by decreasing dopant concentration in the barrier structure, the capacity of the barrier structure to inhibit current flow to the gate electrode can be significantly increased.

However, on the other hand, since the barrier structure is used as a passage for allowing current to flow between the channel layer and the drain electrode or the source electrode, the barrier structure offers a considerable resistance to the flow of drain current. Accordingly, in order to reduce series resistance between the source and the drain, the dopant concentration in the barrier structure must be increased so as to decrease the resistance.

Consequently, in order to increase the capacity of the barrier structure to inhibit current flow, the dopant concentration of the barrier structure must be decreased; however, as a result, the barrier structure has a higher resistance and the series resistance between the source and the drain is increased. In contrast, in order to reduce the series resistance between the source and the drain, the dopant concentration of the barrier structure must be increased so as to have a lower resistance; however, as a result, the capacity of the barrier structure to inhibit current flow is decreased, so that current leakage to the gate electrode is increased.

Because of the technical trade-off described above, even though a heterojunction FET structure having a lower series resistance in addition to having a higher barrier function has been pursued, the FET mentioned above has been heretofore difficult to produce.

Figure 5:
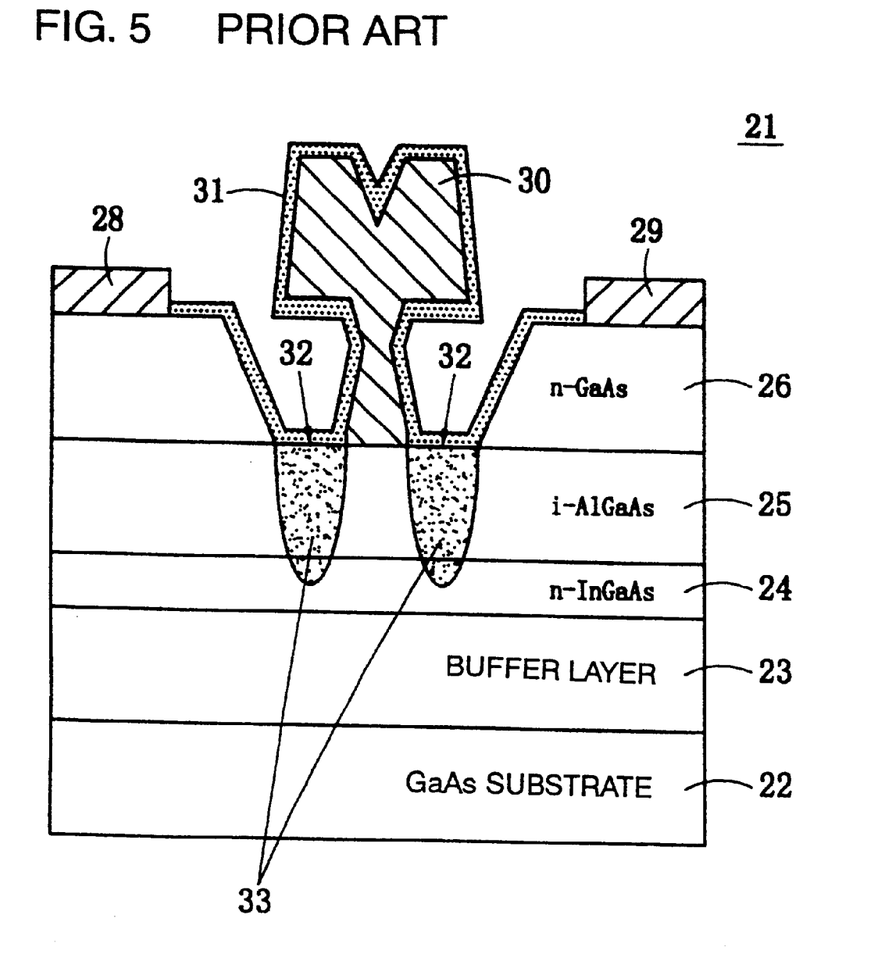
FIG. 5 is a view showing depletion layers generated under flat zones in a conventional DMT.

In addition, in the conventional structure, when the contact layer is selectively etched so as to form a recess therein, the contact layer is also etched in the lateral direction, and hence, flat zones (over-etched portions) are formed at both sides of the gate electrode. In the case of the DMT, as shown in FIG. 5, since depletion layers 33 extend downward from flat zones 32, the series resistance between the source electrode 28 and the drain electrode 29 is further increased, and hence, DC characteristics of the device are further degraded.

SUMMARY OF THE INVENTION

In order to solve the technical problems described above, an object of the present invention is to provide a field-effect semiconductor device provided with a barrier structure having low series resistance to the source and the drain electrode in addition to functioning as a high barrier to the gate electrode.

The field-effect semiconductor device comprises: a channel layer; a barrier structure formed on the channel layer and comprising a plurality of semiconductor layers; a plurality of ohmic electrodes formed above the barrier structure; and a Schottky electrode formed on the barrier structure between the ohmic electrodes. The barrier structure has an electron-affinity less than that of the channel layer and comprises at least two heavily doped layers and a lightly doped layer provided therebetween. The barrier structure may comprise an n-type layer, an undoped layer, and an n-type layer, stacked in that order. The bottom of the Schottky electrode may be in contact with the lightly doped layer in the barrier structure, and the lightly doped layer is preferably 2.5 to 10 nm thick. The semiconductor layers forming the barrier structure may be composed of AlGaAs, and the channel layer may be a heavily doped semiconductor layer.

As described above, according to the present invention, since the field-effect semiconductor device having lower series resistance can be realized while a high Schottky barrier effect is maintained, a field-effect semiconductor device can be realized, which has FET characteristics, such as, high breakdown voltage, maximum drain current, high Gm, and low on-resistance.

For the purpose of illustrating the invention, there is shown in the drawings several forms which are presently preferred, it being understood, however, that the invention is not limited to the precise arrangements and instrumentalities shown.

Other features and advantages of the present invention will become apparent from the following description of the invention which refers to the accompanying drawings.

DETAILED DESCRIPTION OF PREFERRED EMBODIMENTS

A field-effect semiconductor device according to the present invention comprises a channel layer, a barrier structure formed on the channel layer and including a plurality of semiconductor layers, a plurality of ohmic electrodes formed above the barrier structure, and a Schottky electrode formed on the barrier structure between the ohmic electrodes, in which the barrier structure has an electron-affinity less than that of the channel layer and comprises at least two heavily doped layers and a lightly doped layer provided therebetween. The term "heavily doped layer", as used herein, means a layer having a dopant concentration greater than that of the lightly doped layer. The term "lightly doped layer", as used herein, means a layer which has a dopant concentration smaller than that of the heavily doped layer, such as a layer in which a dopant is not intentionally doped therein.

As the barrier structure described above, in particular, a structure comprising an n-type barrier layer, an undoped barrier layer, and an n-type barrier layer, stacked in that order, may be considered as an example, and the barrier structure is preferably composed of AlGaAs. In addition, the channel layer may be formed of an undoped semiconductor layer or a heavily doped semiconductor layer.

When the barrier structure comprises the low resistance heavily doped layers and the high resistance lightly doped layer provided therebetween, as described above, the barrier in the lightly doped layer below the ohmic electrodes is effectively low, so that the resistance in the barrier structure, i.e., the series resistance between the ohmic electrodes, is decreased.

In particular, the effect described above is significant when the lightly doped layer provided between the heavily doped layers is 2.5 to 10 nm thick.

In addition, in the field-effect semiconductor device of the present invention, when the bottom of the Schottky electrode is in contact with the lightly doped layer in the barrier structure, since the Schottky barrier function under the Schottky electrode can be maintained high, FET characteristics having low series resistance in addition to functioning as a high barrier can be realized.

Furthermore, since the heavily doped barrier layer is present below the Schottky electrode, even when the flat zones are formed at both sides of the Schottky electrode, the growth of the depletion layers is suppressed, and as a result, an increase in the series resistance can be prevented.

Hereinafter, the preferred embodiments of the present invention are explained in more detail with reference to the drawings.

Figure 6:
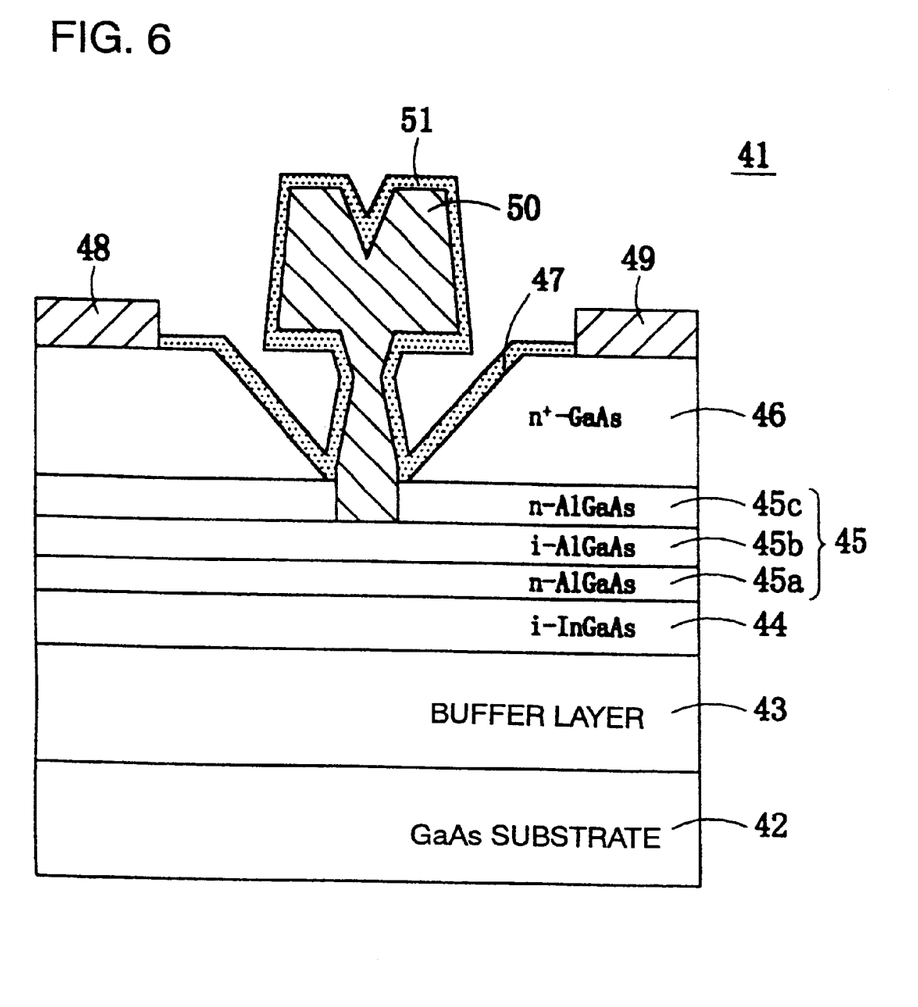
FIG. 6 is a schematic cross-sectional view showing the structure of an HEMT according to an embodiment of the present invention.

FIG. 6 is a schematic cross-sectional view of the structure of an HEMT 41 according to an embodiment of the present invention. In the HEMT 41, a buffer layer 43 is formed on a semi-insulating GaAs substrate 42, a channel layer 44 which is 10 nm thick composed of undoped InGaAs is formed on the buffer layer 43, and a barrier structure 45 (hereinafter referred to as a multi-layered barrier structure) composed of a plurality of layers is formed on the channel layer 44. In FIG. 6, the multi-layered barrier structure 45 has a three-layered structure composed of an n-type AlGaAs layer 45a which is 10 nm thick (the dopant concentration is $3\times10^{18}$ cm$^{-3}$), an undoped AlGaAs layer 45b which is 2.5 to 5 nm thick, and an n-type AlGaAs layer 45c which is 10 nm thick (the dopant concentration is $3\times10^{18}$ cm$^{-3}$). In order to form good ohmic contacts with a source electrode 48 and a drain electrode 49, a contact layer 46 which is 50 nm thick composed of n$^+$-type GaAs (the dopant concentration is $5\times10^{18}$ cm$^{-3}$) is formed on the multi-layered barrier structure 45. In addition, the source electrode 48 and the drain electrode 49 are formed on the upper surface of the contact layer 46 so as to form ohmic contacts therewith. The buffer layer 43, the channel layer 44, the semiconductor barrier layers 45a to 45c forming the multi-layered barrier structure 45, and the contact layer 46 are formed on the semi-insulating GaAs layer 42 in the order mentioned above by epitaxial growth using an MBE (molecular beam epitaxial) method, an MOCVD (metal organic chemical vapor deposition) method, or the like.

The source electrode 48 and the drain electrode 49 are formed on the upper surface of the contact layer 46 so as to be in ohmic contact therewith, and the contact layer is selectively removed between the source electrode 48 and the drain electrode 49 by etching so as to from a recess. The n-type AlGaAs layer 45c is exposed in a recess 47 formed by etching out a part of the contact layer 46, and after a gate electrode 50 is formed on the n-type AlGaAs layer 45c, the bottom of the gate electrode is brought into contact with the undoped AlGaAs layer 45b by thermal diffusion so as to form a Schottky contact therewith. As a result, the bottom portion of the gate electrode 50 is buried in the n-type AlGaAs layer 45c. In addition, the HEMT 41 is finally covered with an insulating protective layer 51 composed of SiN or the like.

Figure 7A:
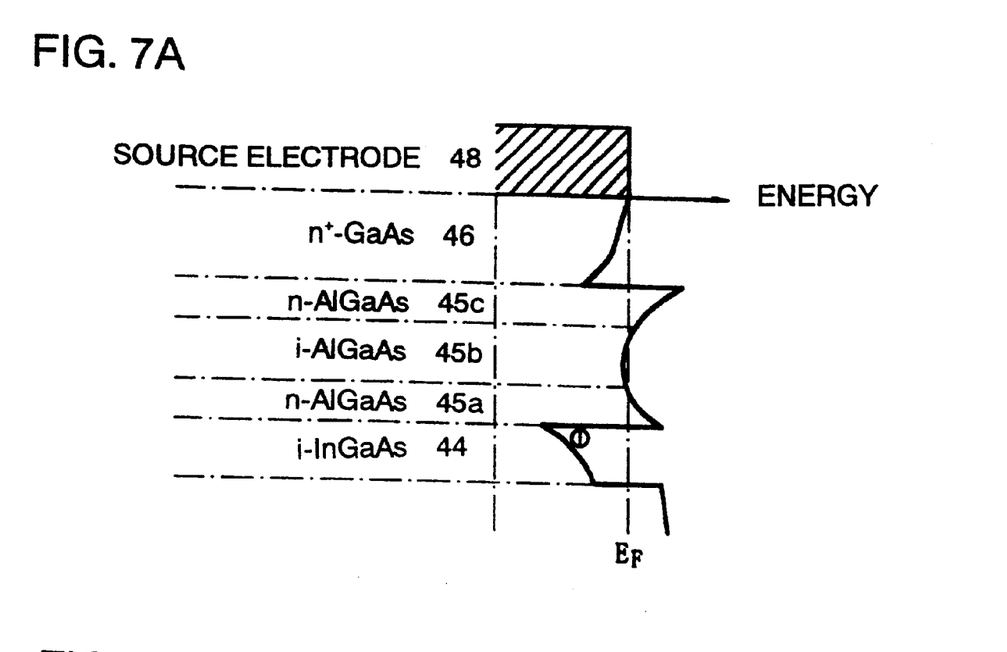
FIG. 7A is a view showing the energy band structure of a conduction band under the source and the drain electrodes of the HEMT mentioned above.
Figure 7B:
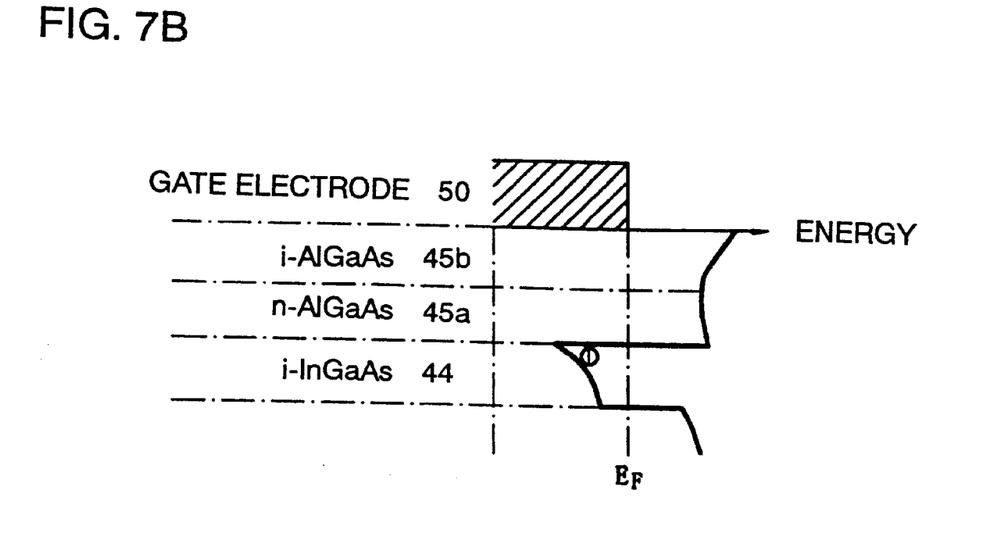
FIG. 7B is a view showing the energy band structure of a conduction band under the gate electrode of the HEMT mentioned above.

In the structure of the HEMT 41 described above, the energy band structure (the bottom of the conduction band) under the source electrode 48 and the drain electrode 49 and the energy band structure (the bottom of the conduction band) under the gate electrode 50 are shown in FIGS. 7A and 7B, respectively. Since, below the source electrode 48 and the drain electrode 49, the multi-layered barrier structure 45 is formed of the heavily doped low resistance n-type AlGaAs layer 45a, the undoped high resistance AlGaAs layer 45b, and the heavily doped low resistance n-type AlGaAs layer 45c, the barrier height in the center layer, i.e., the undoped AlGaAs layer 45b, is effectively lowered in terms of the energy band structure, as shown in FIG. 7A. Consequently, the resistance of the multi-layered barrier structure 45 between the source electrode 48 and the drain electrode 49, i.e., the series resistance between the source electrode 48 and the drain electrode 49, can be decreased.

On the other hand, as shown in FIG. 7B, the multi-layered barrier structure 45 under the gate electrode 50 is composed of the undoped AlGaAs layer 45b and the n-type AlGaAs barrier layer 45a, which is the same structure as the multi-layered barrier structure under the gate electrode 10 in the HEMT 1 of the conventional example.

Accordingly, in the HEMT 41, by decreasing the dopant concentration in the n-type AlGaAs layer 45a, the gate barrier function under the gate electrode 50 can be maintained high, and below the source electrode 48 and the drain electrode 49, the barrier height can be effectively decreased by the undoped AlGaAs layer 45b, so that the series resistance between the source electrode 48 and the drain electrode 49 can be decreased.

In the embodiment shown in FIG. 6, an InGaAs layer is used as the channel layer 44; however, GaAs may be used instead. In addition, in the embodiment, InGaAs is used for the channel layer 44, and AlGaAs is used for the multi-layered barrier structure 45. However, since the channel layer and the multi-layered barrier structure may work so long as a difference in electron-affinity is generated between the materials for the layers mentioned above, a combination of materials such as InGaAg/InGaP may be used. Furthermore, undoped AlGaAs may be first formed for the multi-layered barrier structure 45 on the channel layer 44. For example, a multi-layered barrier structure composed of an undoped (i) AlGaAs layer, an n-type AlGaAs layer, an undoped (i) AlGaAs layer, and an n-type AlGaAs layer may be formed on the channel layer. The thicknesses of the semiconductor layers forming the multi-layered barrier structure 45 are not specifically limited; however, concerning the undoped AlGaAs layer, the thickness thereof is preferably 10 nm or less.

In addition, the multi-layered barrier structure 45 may be a multi-layer structure formed by repeatedly laminating the three-layer structures described above. Furthermore the multi-layered barrier structure 45 may be a double-doped HEMT structure having an electron-supplying layer provided under the channel layer 44.

When the gate electrode 50 is buried in the n-type AlGaAs layer, after forming a recess by etching out a part of the contact layer 46, the n-type AlGaAs layer 45c may be partly removed so as to form a recess therein by anisotropic etching, and the gate electrode 50 may be directly formed on an area at which the undoped AlGaAs layer 45b is exposed.

Second Embodiment

Figure 8:
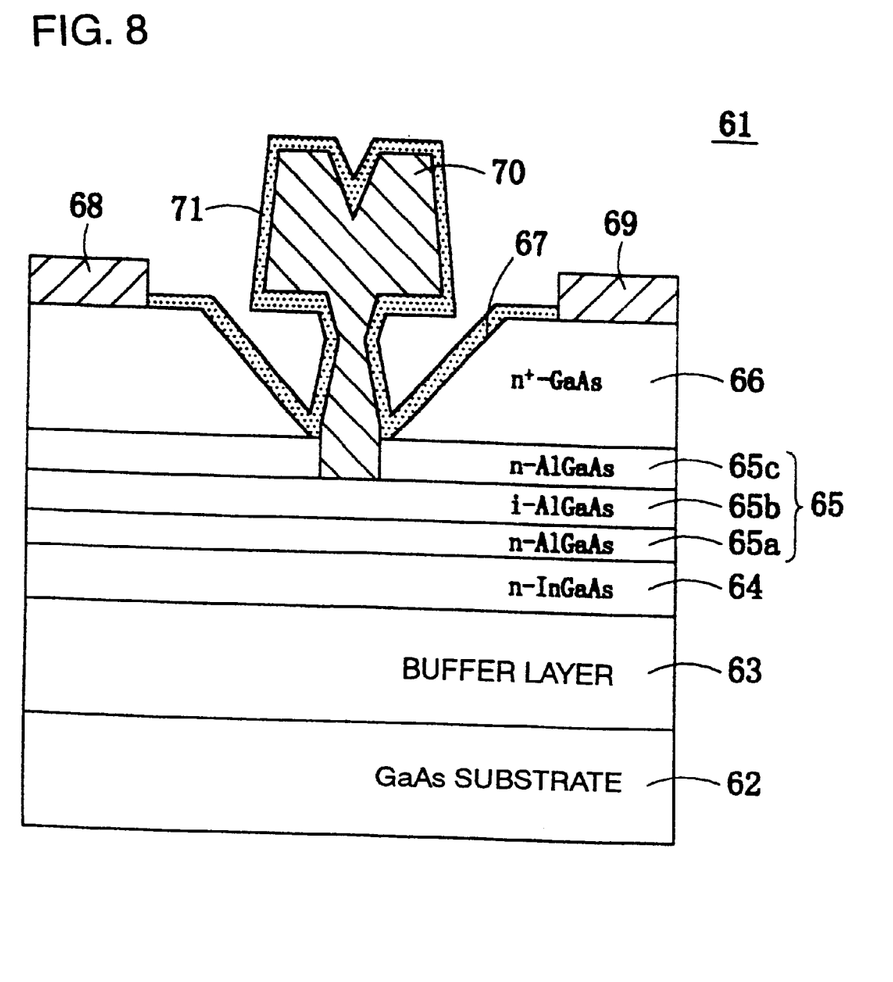
FIG. 8 is a schematic cross-sectional view showing the structure of a DMT according to another embodiment of the present invention.

FIG. 8 is a schematic cross-sectional view of the structure of a DMT according to another embodiment of the present invention. In a DMT 61, a buffer layer 63 is formed on a semi-insulating GaAs substrate 62, a channel layer 64 which is 10 nm thick composed of an n-type InGaAs (the dopant impurity is $2 \times 10^{18}$ cm$^{-3}$) is formed on the buffer layer 63, and a multi-layered barrier structure 65 is formed on the channel layer 64. In FIG. 8, the multi-layered barrier structure 65 has a three-layered structure composed of an n-type AlGaAs layer 65a which is 10 nm thick (the dopant concentration is $3 \times 10^{18}$ cm$^{-3}$), an undoped AlGaAs layer 65b which is 2.5 to 5 nm thick, and an n-type AlGaAs layer 65c which is 10 nm thick (the dopant concentration is $3 \times 10^{18}$ cm$^{-3}$). In order to form good ohmic contacts with a source electrode 68 and a drain electrode 69, a contact layer 66 which is 50 nm thick composed of n$^+$-type GaAs (the dopant concentration is $5 \times 10^{18}$ cm$^{-3}$) is formed on the multi-layered barrier structure 65. In addition, the source electrode 68 and the drain electrode 69 are formed on the upper surface of the contact layer 66 so as to be in ohmic contact therewith. The buffer layer 63, the channel layer 64, the semiconductor barrier layers 65a to 65c forming the multi-layered barrier structure 65, and the contact layer 66 are formed on the semi-insulating GaAs layer 62 in the order mentioned above by epitaxial growth using an MBE method, an MOCVD method, or the like.

Figure 9A:
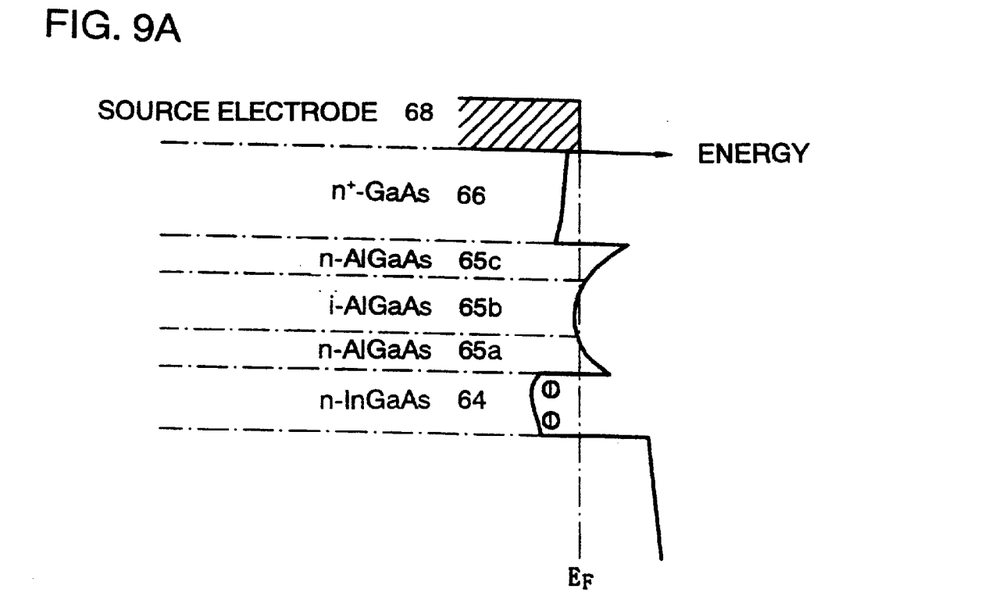
FIG. 9A is a view showing the energy band structure of a conduction band under the source and the drain electrodes of the DMT mentioned above.
Figure 9B:
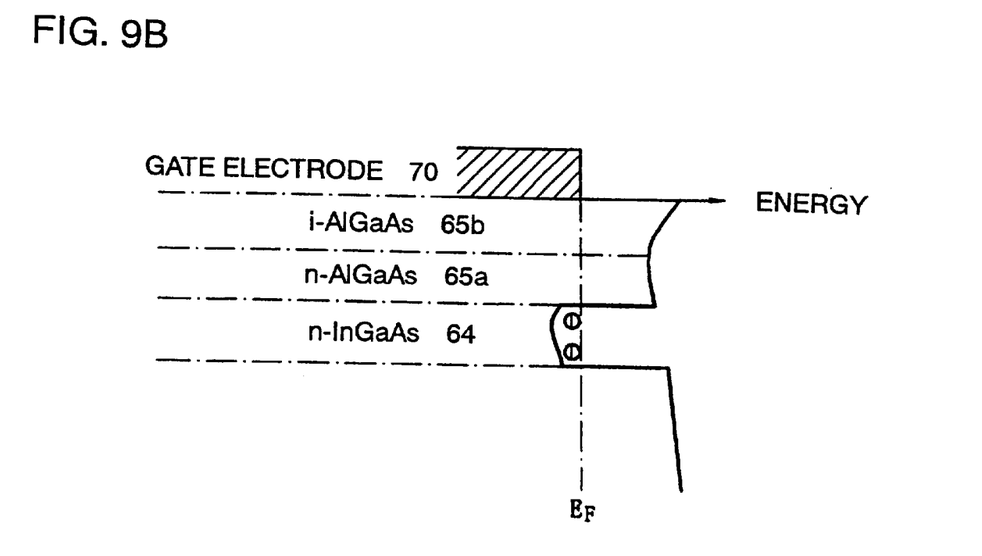
FIG. 9B is a view showing the energy band structure of a conduction band under the gate electrode of the DMT mentioned above.

The source electrode 68 and the drain electrode 69 are provided on the upper surface of the contact layer 66 so as to be in ohmic contact therewith, and the contact layer 66 between the source electrode 68 and the drain electrode 69 is selectively removed by etching so as to form a recess. The n-type AlGaAs layer 65c is exposed in a recess 67 formed by etching out a part of the contact layer 66, and after a gate electrode 70 is formed on the n-type AlGaAs layer 65c, the bottom of the gate electrode is brought into contact with the undoped AlGaAs layer 65b by thermal diffusion so as to form a Schottky contact therewith. As a result, the bottom portion of the gate electrode 70 is buried in the n-type AlGaAs layer 65c. In addition, the DMT 61 is finally covered with an insulating protective layer 71 composed of SiN or the like In the structure of the DMT 61 described above, the energy band structure (the bottom of the conduction band) under the source electrode 68 and the drain electrode 69 and the energy band structure (the bottom of the conduction band) under the gate electrode 70 are shown in FIGS. 9A and 9B, respectively. Since, below the source electrode 68 and the drain electrode 69, the multi-layered barrier structure 65 is composed of the heavily doped low resistance n-type AlGaAs layer 65a, the undoped high resistance AlGaAs layer 65b, and the heavily doped low resistance n-type AlGaAs layer 65c, the barrier height of the center layer, i.e., the undoped AlGaAs layer 65b, is effectively lowered in terms of the energy gap structure, as shown in FIG. 9A. Consequently, the resistance in the multi-layered barrier structure 65 between the source electrode 68 and the drain electrode 69, i.e., the series resistance between the source electrode 68 and the drain electrode 69, can be decreased.

On the other hand, as shown in FIG. 9B, the multi-layered barrier structure 65 under the gate electrode 70 is composed of the undoped AlGaAs layer 65b and the n-type AlGaAs barrier layer 65a, and the gate barrier function can be increased by decreasing the dopant concentration in the n-type AlGaAs layer 65a.

Accordingly, also in the DMT 61, by decreasing the dopant concentrations in the n-type AlGaAs layers 65a and 65c, the gate barrier function under the gate electrode 70 can be maintained high, and in addition, under the source electrode 68 and the drain electrode 69, the series resistance can be decreased by effectively lowering the barrier height by the undoped AlGaAs layer 65b.

Figure 10:
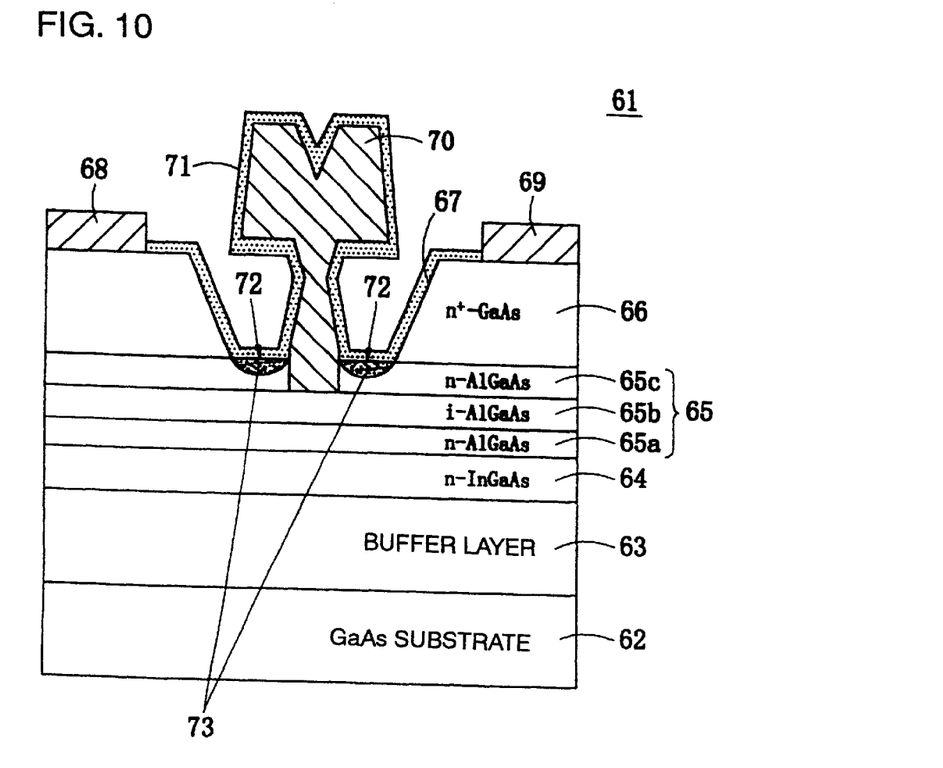
FIG. 10 is a view showing depletion layers generated under flat zones in the DMT mentioned above.

In addition, since the undoped AlGaAs layer only exists between the gate electrode 30 and the channel layer 24 in the conventional DMT 21, when the flat zones are formed on both sides of the gate electrode, the depletion layers extend further downward, as shown in FIG. 5. In contrast, in the DMT 61, since the multi-layered barrier structure 65 composed of the n-type AlGaAs layer 65a, the undoped AlGaAs layer 65b, and the n-type AlGaAs layer 65c exists between the gate electrode 70 and the channel layer 64, as shown in FIG. 10, even when flat zones 72 are formed on both sides of the gate electrode 70, it is difficult for depletion layers 73 to extend downward beyond the n-type AlGaAs layer 65c, and hence, an increase in the series resistance between the source electrode 68 and the drain electrode 69 caused by the flat zones 72 can be suppressed.

Figure 11:
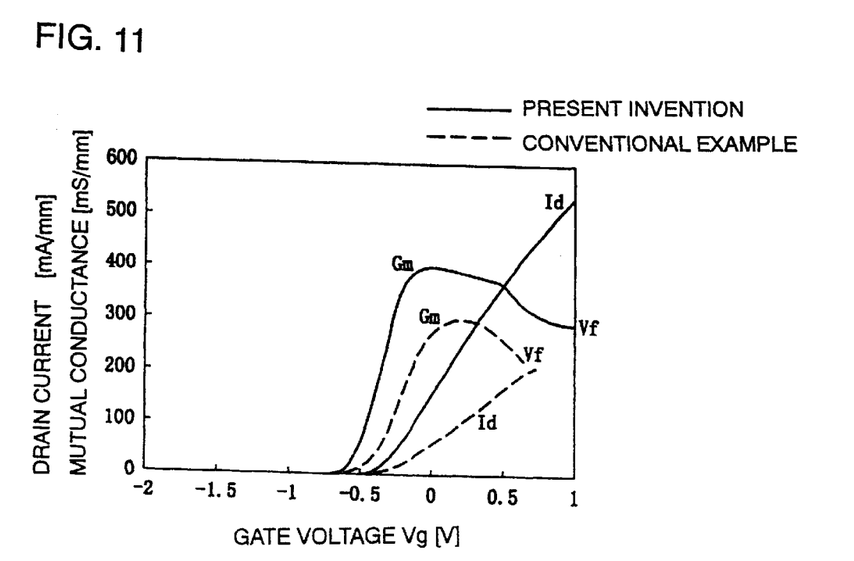
FIG. 11 is a graph showing the current-voltage characteristics of a DMT according to an embodiment of the present invention compared with those of a conventional DMT.

FIG. 11 is a graph showing the current-voltage characteristics of a DMT (DCHFET), which has the structure similar to that described above, according to an embodiment of the present invention compared with those of a conventional DMT. In the figure, the horizontal axis represents the gate voltage Vg (V), and the vertical axis represents the drain current (linear current density) Id (mA/mm) and the mutual conductance Gm (mS/mm). In addition, the solid line indicates the results for the DMT of the present invention, and the dashed line indicates the results for the conventional DMT. As can be seen in the figure, it is understood that a higher current and a higher Gm can be obtained for the DMT of the present invention than those for the conventional DMT.

In the DMT 61 in FIG. 8, InGaAs is used for the channel layer 64; however, GaAs may be used instead. In addition, in the embodiment, InGaAs is used for the channel layer 64, and AlGaAs is used for the multi-layered barrier structure 65. However, since the channel layer and the multi-layered barrier structure may work so long as a difference in electron-affinity is generated between the materials for the layers mentioned above, a combination of materials such as InGaAg/InGaP may be used. Furthermore, in the DMT, undoped AlGaAs may be first formed for the multi-layered barrier structure 65 on the channel layer 64. For example, a multi-layered barrier structure composed of an undoped (i) AlGaAs layer, an n-type AlGaAs layer, an undoped (i) AlGaAs layer, and an n-type AlGaAs layer may be formed on the channel layer. The thicknesses of the semiconductor barrier layers forming the multi-layered barrier structure are not specifically limited; however, concerning the undoped AlGaAs barrier layer, the thickness thereof is preferably 10 nm thick or less.

In addition, the multi-layered barrier structure may be a multi-layer structure formed by repeatedly laminating the three-layer structures as shown in FIG. 8. Furthermore the multi-layered barrier structure may be a structure having an electron supplying layer provided under the channel layer.

In the case in which the gate electrode 70 is buried in the n-type AlGaAs layer 65c, after forming a recess by etching out a part of the contact layer 66, the n-type AlGaAs layer 65c may be partly removed so as to form a recess therein by anisotropic etching, and the gate electrode 70 may be directly formed on an area at which the undoped AlGaAs layer 45b is exposed.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A field-effect semiconductor device comprising:

a channel layer;

a barrier structure formed on the channel layer and comprising a plurality of semiconductor layers;

a plurality of ohmic electrodes formed above the barrier structure; and a Schottky electrode formed on the barrier structure between the ohmic electrode;

wherein the barrier structure has an electron-affinity less than that of the channel layer and comprises at least two heavily doped layers and a lightly doped layer provided therebetween; and wherein each of said plurality of semiconductor layers of said barrier structure is made of the same material.

2. A field-effect semiconductor device according to claim 1, wherein the barrier structure comprises an n-type layer, an undoped layer, and an n-type layer, stacked in that order.

3. A field-effect semiconductor device according to claim 1, wherein the bottom of the Schottky electrode is in contact with the lightly doped layer in the barrier structure.

4. A field-effect semiconductor device according to one of claims 1 to 3, wherein the lightly doped layer provided between the heavily doped layers in the barrier structure is 2.5 to 10 nm thick.

5. A field-effect semiconductor device according to one of claims 1 to 3, wherein the semiconductor layers forming the barrier structure are each composed of AlGaAs.

6. A field-effect semiconductor device according to claim 4, wherein the semiconductor layers forming the barrier structure are each composed of AlGaAs.

7. A field-effect semiconductor device according to one of claims 1 to 3, wherein the channel layer is a heavily doped semiconductor layer.

8. A field-effect semiconductor device according to claim 4, wherein the channel layer is a heavily doped semiconductor layer.

9. A field-effect semiconductor device according to claim 5, wherein the channel layer is a heavily doped semiconductor layer.

10. A field-effect semiconductor device according to claim 6, wherein the channel layer is a heavily doped semiconductor layer.

11. A field-effect semiconductor device comprising:

a channel layer;

a barrier structure formed on the channel layer and comprising a plurality of semiconductor layers;

a plurality of ohmic electrodes formed above the barrier structure; and a Schottky electrode formed on the barrier structure between the ohmic electrodes;

wherein the barrier structure has an electron-affinity less than that of the channel layer and comprises at least two first type layers and a second type layer provided therebetween, the second type layer having a lower resistivity than either of the first type layers; and wherein each of said plurality of semiconductor layers of said barrier structure is made of the same material.

* * * * *